United States Patent
Chen et al.

(10) Patent No.: US 9,202,708 B1
(45) Date of Patent: Dec. 1, 2015

(54) DOPED SILICON OXIDE ETCH

(71) Applicant: Applied Materials, Inc., Santa Clara, CA (US)

(72) Inventors: Zhijun Chen, San Jose, CA (US); Sang-jin Kim, Santa Clara, CA (US); Anchuan Wang, San Jose, CA (US); Nitin K. Ingle, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/523,647

(22) Filed: Oct. 24, 2014

(51) Int. Cl.
*H01L 21/302* (2006.01)
*H01L 21/461* (2006.01)
*H01L 21/311* (2006.01)

(52) U.S. Cl.
CPC .............................. *H01L 21/31116* (2013.01)

(58) Field of Classification Search
USPC ................... 438/704, 706, 738, 743
See application file for complete search history.

(56) References Cited

U.S. PATENT DOCUMENTS

2003/0109143 A1* 6/2003 Hsieh et al. .................... 438/710
2012/0211462 A1* 8/2012 Zhang et al. ..................... 216/13

* cited by examiner

*Primary Examiner* — Karen Kusumakar
(74) *Attorney, Agent, or Firm* — Kilpatrick Townsend & Stockton LLP

(57) ABSTRACT

A method of etching exposed silicon oxide on patterned heterogeneous structures is described and includes a gas phase etch using plasma effluents formed in a remote plasma. The remote plasma excites a fluorine-containing precursor in combination with an oxygen-containing precursor. Plasma effluents within the remote plasma are flowed into a substrate processing region where the plasma effluents combine with water vapor or an alcohol. The combination react with the patterned heterogeneous structures to remove two separate regions of silicon oxide at distinct etch rates. The methods may be used to remove doped silicon oxide faster than undoped silicon oxide or more lightly-doped silicon oxide. The relative humidity in the substrate processing region may be low during the etch process to increase the etch selectivity of the doped silicon oxide.

15 Claims, 6 Drawing Sheets

DOPED SILICON OXIDE ETCH

FIELD

Embodiments of the invention relate to selectively etching doped silicon oxide.

BACKGROUND

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers or thinning lateral dimensions of features already present on the surface. Often it is desirable to have an etch process which etches one material faster than another helping e.g. a pattern transfer process proceed. Such an etch process is said to be selective of the first material relative to the second material. As a result of the diversity of materials, circuits and processes, etch processes have been developed with a selectivity towards a variety of materials.

Dry etch processes are often desirable for selectively removing material from semiconductor substrates. The desirability stems from the ability to gently remove material from miniature structures with minimal physical disturbance. Dry etch processes also allow the etch rate to be abruptly stopped by removing the gas phase reagents. Some dry-etch processes involve the exposure of a substrate to remote plasma by-products formed from one or more precursors. For example, remote plasma excitation of ammonia and nitrogen trifluoride enables silicon oxide to be selectively removed from a patterned substrate when the plasma effluents are flowed into the substrate processing region.

Methods are needed to progressively expand this suite of selectivities in order to enable novel process flows.

SUMMARY

A method of etching exposed silicon oxide on patterned heterogeneous structures is described and includes a gas phase etch using plasma effluents formed in a remote plasma. The remote plasma excites a fluorine-containing precursor in combination with an oxygen-containing precursor. Plasma effluents within the remote plasma are flowed into a substrate processing region where the plasma effluents combine with water vapor or an alcohol. The combination react with the patterned heterogeneous structures to remove two separate regions of silicon oxide at distinct etch rates. The methods may be used to remove doped silicon oxide faster than undoped silicon oxide or more lightly-doped silicon oxide. The relative humidity in the substrate processing region may be low during the etch process to increase the etch selectivity of the doped silicon oxide.

Embodiments of the invention include methods of etching a patterned substrate. The methods include placing the patterned substrate in a substrate processing region of a substrate processing chamber. The patterned substrate has an exposed doped silicon oxide portion and a second exposed silicon oxide portion. The methods further include flowing a fluorine-containing precursor into a remote plasma region fluidly coupled to the substrate processing region while forming a remote plasma in the remote plasma region to produce plasma effluents. The methods further include flowing a hydrogen-and-oxygen-containing precursor into the substrate processing region without first passing the hydrogen-and-oxygen-containing precursor through the remote plasma region. The hydrogen-and-oxygen-containing precursor comprises an OH group. The methods further include maintaining a relative humidity in the substrate processing region, wherein the relative humidity is below 14%. The methods further include etching the exposed doped silicon oxide portion by flowing the plasma effluents into the substrate processing region. The exposed doped silicon oxide portion has a higher dopant concentration than the second exposed silicon oxide portion. The exposed doped silicon oxide portion etches at a first etch rate and the second exposed silicon oxide portion etches at a second etch rate which is lower than the first etch rate.

Embodiments of the invention include methods of etching a patterned substrate. The methods include placing the patterned substrate in a substrate processing region of a substrate processing chamber. The patterned substrate has an exposed phosphorus-doped silicon oxide portion and a second exposed silicon oxide portion and wherein the exposed phosphorus-doped silicon oxide portion has an exposed phosphorus-depleted outer portion. The methods further include flowing a fluorine-containing precursor into a remote plasma region fluidly coupled to the substrate processing region while forming a remote plasma in the remote plasma region to produce plasma effluents. The methods further include flowing a hydrogen-and-oxygen-containing precursor into the substrate processing region without first passing the hydrogen-and-oxygen-containing precursor through the remote plasma region. The hydrogen-and-oxygen-containing precursor comprises an OH group. The methods further include maintaining a first relative humidity in the substrate processing region during the removing operation. The methods further include removing the exposed phosphorus-depleted outer portion of the exposed phosphorus-doped silicon oxide portion. The methods further include reducing a relative humidity in the substrate processing region from the first relative humidity to a second relative humidity. The second relative humidity is less than the first relative humidity. The methods further include etching the exposed phosphorus-doped silicon oxide portion by flowing the plasma effluents into the substrate processing region. The exposed phosphorus-doped silicon oxide portion has a higher phosphorus concentration than the second exposed silicon oxide portion. The exposed phosphorus-doped silicon oxide portion etches at a first etch rate and the second exposed silicon oxide portion etches at a second etch rate which is lower than the first etch rate.

Embodiments of the invention include methods of etching a patterned substrate. The methods include placing the patterned substrate in a substrate processing region of a substrate processing chamber. The patterned substrate has a first exposed phosphorus-doped silicon oxide portion and a second exposed phosphorus-doped silicon oxide portion. The methods further include flowing nitrogen trifluoride into a remote plasma region fluidly coupled to the substrate processing region while forming a remote plasma in the remote plasma region to produce plasma effluents. The methods further include flowing water vapor into the substrate processing region without first passing the water vapor through the remote plasma region. The methods further include maintaining a relative humidity of less than 14% in the substrate processing region. The methods further include etching the first exposed phosphorus-doped silicon oxide portion by flowing the plasma effluents into the substrate processing region. The first exposed phosphorus-doped silicon oxide portion has a higher atomic concentration of phosphorus than the second exposed phosphorus-doped silicon oxide portion. The first exposed phosphorus-doped silicon oxide portion etches at a first etch rate and the second exposed phosphorus-doped silicon oxide portion etches at a second etch rate which is lower than the first etch rate.

Additional embodiments and features are set forth in part in the description that follows, and in part will become apparent to those skilled in the art upon examination of the specification or may be learned by the practice of the disclosed embodiments. The features and advantages of the disclosed embodiments may be realized and attained by means of the instrumentalities, combinations, and methods described in the specification.

DESCRIPTION OF THE DRAWINGS

A further understanding of the nature and advantages of the embodiments may be realized by reference to the remaining portions of the specification and the drawings.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

A method of etching exposed silicon oxide on patterned heterogeneous structures is described and includes a gas phase etch using plasma effluents formed in a remote plasma. The remote plasma excites a fluorine-containing precursor in combination with an oxygen-containing precursor. Plasma effluents within the remote plasma are flowed into a substrate processing region where the plasma effluents combine with water vapor or an alcohol. The combination react with the patterned heterogeneous structures to remove two separate regions of silicon oxide at distinct etch rates. The methods may be used to remove doped silicon oxide faster than undoped silicon oxide or more lightly-doped silicon oxide. The relative humidity in the substrate processing region may be low during the etch process to increase the etch selectivity of the doped silicon oxide.

Selective remote gas phase etch processes have used a hydrogen-containing precursor of ammonia ($NH_3$) and a fluorine-containing precursor of nitrogen trifluoride ($NF_3$) which together flow through a remote plasma and into a substrate processing region. These remote gas phase etch processes remove oxide films much more rapidly than, e.g. silicon. However, there is very little difference among etch rates between different types of silicon oxide. The methods disclosed herein may exhibit a significantly greater etch rate of doped silicon oxide (e.g. BSG, PSG or BPSG) relative to more lightly-doped silicon oxide or undoped silicon oxide (USG). Silicon oxide having less dopant may require a greater humidity level for etch reactions to proceed, therefore reducing the humidity level increases the observed etch selectivities.

Figure 1:
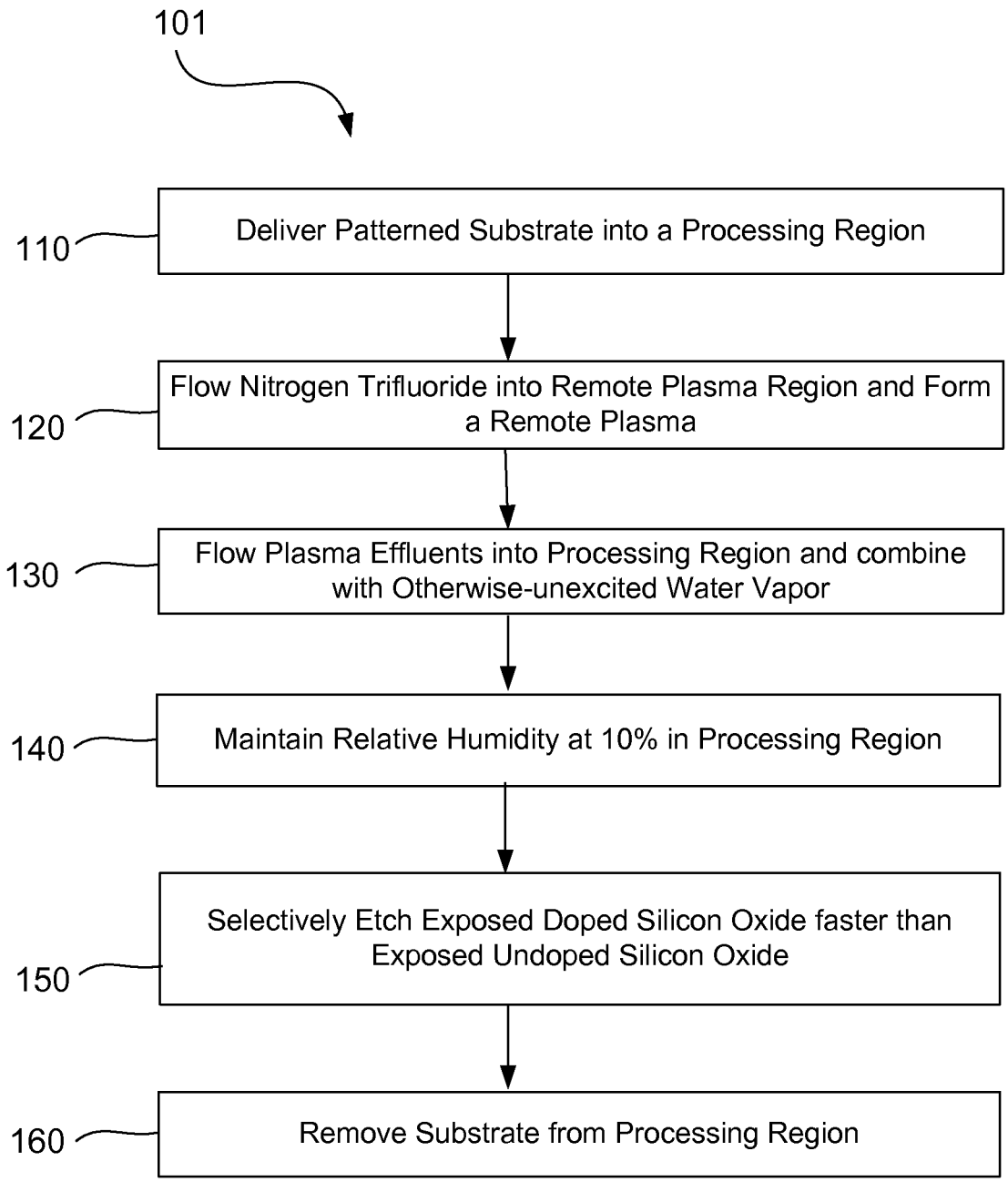
FIG. 1 is a flow chart of a silicon oxide selective etch process according to embodiments.

In order to better understand and appreciate the invention, reference is now made to FIG. 1 which is a flow chart of a silicon oxide selective etch process 101 according to embodiments. Prior to the first operation, the substrate is patterned and a doped silicon oxide portion is formed on the patterned substrate. An undoped silicon oxide portion (USG or undoped silicate glass) is formed above the doped silicon oxide. The patterned substrate is then placed within the substrate processing region in operation 110.

Nitrogen trifluoride is flowed into a remote plasma region (operation 120). The nitrogen trifluoride is excited in a remote plasma formed in the remote plasma region. The remote plasma system is positioned next to the substrate processing region and fluidly coupled through a showerhead. Other sources of fluorine may be used to augment or replace the nitrogen trifluoride. In general, a fluorine-containing precursor is flowed into the plasma region and the fluorine-containing precursor comprises at least one precursor selected from the group consisting of atomic fluorine, diatomic fluorine, nitrogen trifluoride, carbon tetrafluoride, hydrogen fluoride and xenon difluoride. The remote plasma region may be within a distinct module from the processing chamber and/or a compartment within the processing chamber. The plasma effluents formed in the remote plasma are then flowed into the substrate processing region (operation 130). Water vapor is simultaneously flowed into the substrate processing region and combined with the plasma effluents. The water vapor is not passed through the remote plasma region and therefore may only be excited by interaction with the plasma effluents according to embodiments. The water vapor is not passed through any remote plasma region before entering the substrate processing region in embodiments. The relative humidity is maintained at about 10% (operation 140) during operations 120, 130 and/or the etching of the patterned substrate described next.

The patterned substrate is selectively etched (operation 150) such that the doped silicon oxide is removed at a higher rate than the undoped silicon oxide. Using the gas phase dry etch processes described herein, etch selectivities of 250:1 (doped SiO etch rate:undoped SiO etch rate) are possible. The doped silicon oxide etch rate may exceed the undoped silicon oxide etch rate by a multiplicative factor of about 20 or more, about 40 or more, about 75 or more, or about 100 or more, according to embodiments. The reactive chemical species are removed from the substrate processing region and then the substrate is removed from the processing region (operation 160).

Figure 2:
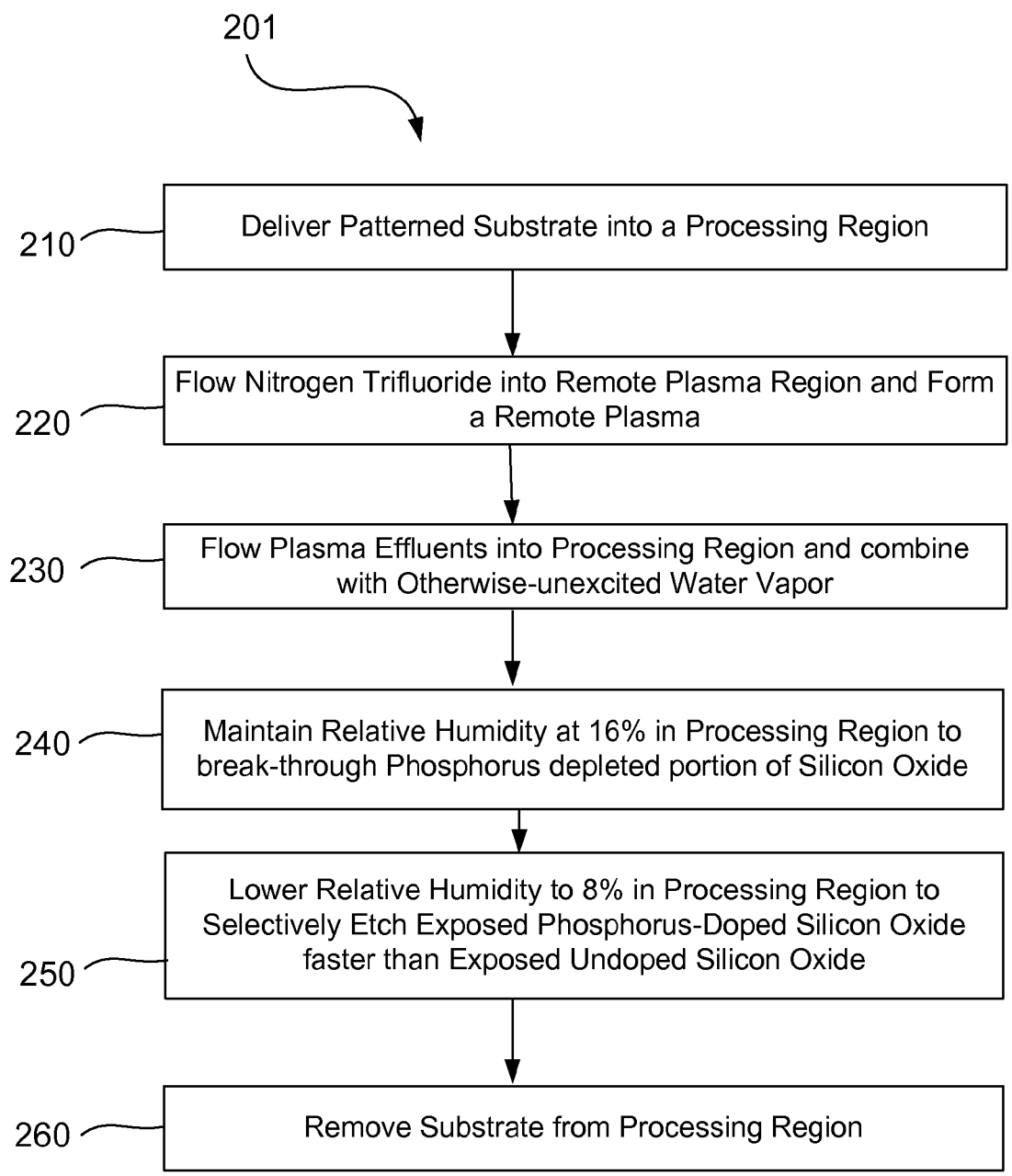
FIG. 2 is a flow chart of a silicon oxide selective etch process according to embodiments.

Reference is now made to FIG. 2 which is a flow chart of a silicon oxide selective etch process 201 according to embodiments. Prior to the first operation, the substrate is patterned and a phosphorus-doped silicon oxide portion is formed on the patterned substrate. An undoped silicon oxide (USG or undoped silicate glass) layer is formed above the phosphorus-doped silicon oxide. The patterned substrate is then placed within the substrate processing region in operation 210.

Nitrogen trifluoride is flowed into the remote plasma region (operation 220). The nitrogen trifluoride is excited in the remote plasma formed in the remote plasma region. Other sources of fluorine may be used to augment or replace the nitrogen trifluoride as described earlier. The plasma effluents formed in the remote plasma are then flowed into the substrate processing region (operation 230). Water vapor is simultaneously flowed into the substrate processing region and combined with the plasma effluents. The water vapor is not passed through the remote plasma region and therefore may only be excited by interaction with the plasma effluents in embodiments. The water vapor is not passed through any remote plasma region before entering the substrate processing region according to embodiments. The relative humidity is maintained at about 16% (operation 240) during operations 220, 230 and/or 240. The relatively high level of humidity may be useful for phosphorus-doped silicon oxide to break through a thin layer which may be phosphorus-depleted. The phosphorus-depleted "skin" of the phosphorus-doped silicon oxide portion may be present in certain process sequences due to the high mobility of the phosphorus. The thin phosphorus-depleted layer may behave more like undoped silicon oxide and be removed by using relatively high humidity. The thin phosphorus-depleted portion is removed in operation 240. The thin phosphorus-depleted portion may be less than 1 nm in thickness and may have an atomic concentration of phosphorus less than 1%.

The relative humidity in the substrate processing region may be reduced and maintained at a lower level once the thin phosphorus-depleted layer is out of the way. The relative humidity is maintained at about 8% during operation 250. The patterned substrate is selectively etched in operation 250 such that the phosphorus-doped silicon oxide is removed at a higher rate than the undoped silicon oxide. The etch selectivities described earlier also apply to silicon oxide selective etch process 201. The reactive chemical species are removed from the substrate processing region and then the substrate is removed from the processing region (operation 260).

The thin phosphorus-depleted layer may be present in phosphorus silicate glass where boron is not present or present in small concentrations relative to the phosphorus concentration. The phosphorus-doped silicon oxide portion may alternatively be boron phosphorus silicate glass (BPSG) with a relatively small concentration of boron. The boron concentration may be less than 6%, less than 4%, less than 3% or less than 2% of the phosphorus-doped silicon oxide portion. The boron concentration may be less than 20%, less than 15% or less than 10% of the phosphorus concentration according to embodiments. All concentrations and percentages herein are calculated using atomic concentrations.

Regardless of whether boron is present, the atomic concentration of phosphorus may be greater than 5%, greater than 7% or greater than 10% of the phosphorus-doped silicon oxide portion. There may be a first exposed phosphorus-doped silicon oxide portion and a second exposed phosphorus-doped silicon oxide portion. The atomic concentration of phosphorus of the first exposed phosphorus-doped silicon oxide portion may be greater than an atomic concentration of phosphorus in the second exposed phosphorus-doped silicon oxide portion. The etch rate of the first exposed phosphorus-doped silicon oxide portion may exceed the etch rate of the second exposed phosphorus-doped silicon oxide portion by the multiplicative values provided elsewhere herein.

The relative humidity in the substrate processing region during operation 240 may be greater than 14%, greater than 15% or greater than 17% according to embodiments. During operation 250 (and operation 140 in FIG. 1) may be below 14%, below 12%, below 10% or below 8% in embodiments. The doped silicon oxide may generally be boron-doped silicon oxide, phosphorus-doped silicon oxide or boron-and-phosphorus-doped silicon oxide. The relative humidity in the substrate processing region during operation 250 may be 20%, 30% or 40% lower than the relative humidity in operation 240 in the case of the phosphorus-doped silicon oxide example.

The methods presented herein exhibit high etch selectivity of the exposed doped silicon oxide portion relative to a second silicon oxide portion (which is either undoped or more lightly doped). In operations 150 and 250, the etch selectivity of the exposed doped silicon oxide portion relative to the second silicon oxide portion may be greater than 8:1, greater than 16:1, greater than 25:1 or greater than 50:1 according to embodiments. The etch rate of the exposed doped silicon oxide may be referred to as the first etch rate and the etch rate of the second silicon oxide portion may be referred to herein as the second etch rate. The first etch rate may exceed the second etch rate by a factor of more than 8, more than 16, more than 25 or more than 50 in embodiments.

The gas phase etches described herein may not produce solid residue even at low substrate temperatures. Elimination of solid residue during the process avoids any potential disturbance of delicate features such as thin line structures. Elimination of solid residue also simplifies the process flows and decreases processing costs by removing a sublimation step. The fluorine-containing precursor, the remote plasma region and/or the substrate processing region are devoid of hydrogen during operation 150 in embodiments. The plasma effluents may also be devoid of hydrogen according to embodiments. Lack of hydrogen ensures minimal or no production of solid by-products on the patterned substrate.

In the examples presented herein, water was introduced through the showerhead into the substrate processing region without prior plasma excitation. Generally speaking, a hydrogen-and-oxygen-containing precursor may be introduced in this manner. The hydrogen-and-oxygen-containing precursor may include an OH group. The hydrogen-and-oxygen-containing precursor may be one of water or an alcohol according to embodiments. The alcohol may include one or more of methanol, ethanol and isopropyl alcohol in embodiments. The hydrogen-and-oxygen-containing-precursor may not pass through a remote plasma before entering the substrate processing region according to embodiments.

The pressure in the substrate processing region and the remote plasma region(s) during the etching operations may be between 0.1 Torr and 50 Torr, between 1 Torr and 15 Torr or between 3 Torr and 6 Torr in embodiments. Lowering the pressure generally increases the selectivity of doped silicon oxide having a greater dopant density. The temperature of the patterned substrate during the etching operations may be between −20° C. and 250° C., between 0° C. and 50° C. or between 5° C. and 20° C. in embodiments. The relative humidity may be may be maintained at the target levels described herein by selecting values for one or more of substrate temperature, pressure or flow rates of the various precursors. Flow rate ranges are given in the course of describing exemplary equipment.

The method also includes applying power to the fluorine-containing precursor during operations 120 and 220 in the remote plasma regions to generate the plasma effluents. The plasma parameters described herein apply to remote plasmas used to etch the patterned substrate. As would be appreciated by one of ordinary skill in the art, the plasma may include a number of charged and neutral species including radicals and ions. The plasma may be generated using known techniques (e.g., RF, capacitively coupled, inductively coupled). In an embodiment, the remote plasma power may be applied to the remote plasma region at a level between 500 W and 10 kW for a remote plasma external to the substrate processing chamber. The remote plasma power may be applied using inductive coils, in embodiments, in which case the remote plasma will be referred to as an inductively-coupled plasma (ICP) or may be applied using capacitive plates, in which case the remote plasma will be referred to as a capacitive-coupled plasma (CCP). According to embodiments, the remote plasma power may be applied to the remote plasma region at a level between 25 W and 500 W for a remote plasma within the substrate processing chamber.

Generally speaking, the patterned substrate will include an exposed doped silicon oxide portion and a second exposed silicon oxide portion which is either doped less than the exposed doped silicon oxide portion or undoped as shown in the examples. The exposed doped silicon oxide portion will have distinct dopants or distinct dopant concentrations compared to the second exposed silicon oxide portion. The exposed doped silicon oxide portion may contain a dopant concentration greater than that of the second exposed silicon oxide portion according to embodiments. Etching may take place in deep narrow "high aspect ratio" trenches whose sidewalls include the exposed doped silicon oxide portion and the second exposed silicon oxide portion. The exposed doped silicon oxide portion may form a lower portion of the sidewall of a high aspect ratio trench than the second exposed silicon oxide portion in embodiments. In such a case, the high aspect ratio trench is widened more rapidly deep within the high aspect ratio trench which may be helpful in producing dynamic random access memory (DRAM) cells. In addition to selecting etch rate differences, the parameters described herein may be adjusted to select surface roughness which may be useful in increasing surface area and capacitance for a DRAM cell. Other devices may also benefit from the silicon oxide selective etch processes described herein.

For both treatment remote plasmas and etch remote plasmas, the flows of the precursors into the remote plasma region may further include one or more relatively inert gases such as He, $N_2$, Ar. The inert gas can be used to improve plasma stability, ease plasma initiation, and improve process uniformity. Argon may be helpful, as an additive, to promote the formation of a stable plasma. Process uniformity is generally increased when helium is included. These additives are present in embodiments throughout this specification. Flow rates and ratios of the different gases may be used to control etch rates and etch selectivity. The flow rates of inert gases may be increased to reduce the relative humidity.

In embodiments, an ion suppressor (which may be the showerhead) may be used to provide radical and/or neutral species for gas-phase etching. The ion suppressor may also be referred to as an ion suppression element. In embodiments, for example, the ion suppressor is used to filter etching plasma effluents en route from the remote plasma region to the substrate processing region. The ion suppressor may be used to provide a reactive gas having a higher concentration of radicals than ions. Plasma effluents pass through the ion suppressor disposed between the remote plasma region and the substrate processing region. The ion suppressor functions to dramatically reduce or substantially eliminate ionic species traveling from the plasma generation region to the substrate. The ion suppressors described herein are simply one way to achieve a low electron temperature in the substrate processing region during the gas-phase etch processes described herein.

In embodiments, an electron beam is passed through the substrate processing region in a plane parallel to the substrate to reduce the electron temperature of the plasma effluents. A simpler showerhead may be used if an electron beam is applied in this manner. The electron beam may be passed as a laminar sheet disposed above the substrate in embodiments. The electron beam provides a source of neutralizing negative charge and provides a more active means for reducing the flow of positively charged ions towards the substrate and increasing the etch selectivity in embodiments. The flow of plasma effluents and various parameters governing the operation of the electron beam may be adjusted to lower the electron temperature measured in the substrate processing region.

The electron temperature may be measured using a Langmuir probe in the substrate processing region during excitation of a plasma in the remote plasma. In aluminum removal embodiments, the electron temperature may be less than 0.5 eV, less than 0.45 eV, less than 0.4 eV, or less than 0.35 eV. These extremely low values for the electron temperature are enabled by the presence of the electron beam, showerhead and/or the ion suppressor. Uncharged neutral and radical species may pass through the electron beam and/or the openings in the ion suppressor to react at the substrate. Such a process using radicals and other neutral species can reduce plasma damage compared to conventional plasma etch processes that include sputtering and bombardment. Embodiments of the present invention are also advantageous over conventional wet etch processes where surface tension of liquids can cause bending and peeling of small features. In point of contrast, the electron temperature during the aluminum oxide removal process may be greater than 0.5 eV, greater than 0.6 eV or greater than 0.7 eV according to embodiments.

The substrate processing region may be described herein as "plasma-free" during the etch processes described herein. "Plasma-free" does not necessarily mean the region is devoid of plasma. Ionized species and free electrons created within the plasma region may travel through pores (apertures) in the partition (showerhead) at exceedingly small concentrations. The borders of the plasma in the chamber plasma region are hard to define and may encroach upon the substrate processing region through the apertures in the showerhead. Furthermore, a low intensity plasma may be created in the substrate processing region without eliminating desirable features of the etch processes described herein. All causes for a plasma having much lower intensity ion density than the chamber plasma region during the creation of the excited plasma effluents do not deviate from the scope of "plasma-free" as used herein.

Figure 3A:
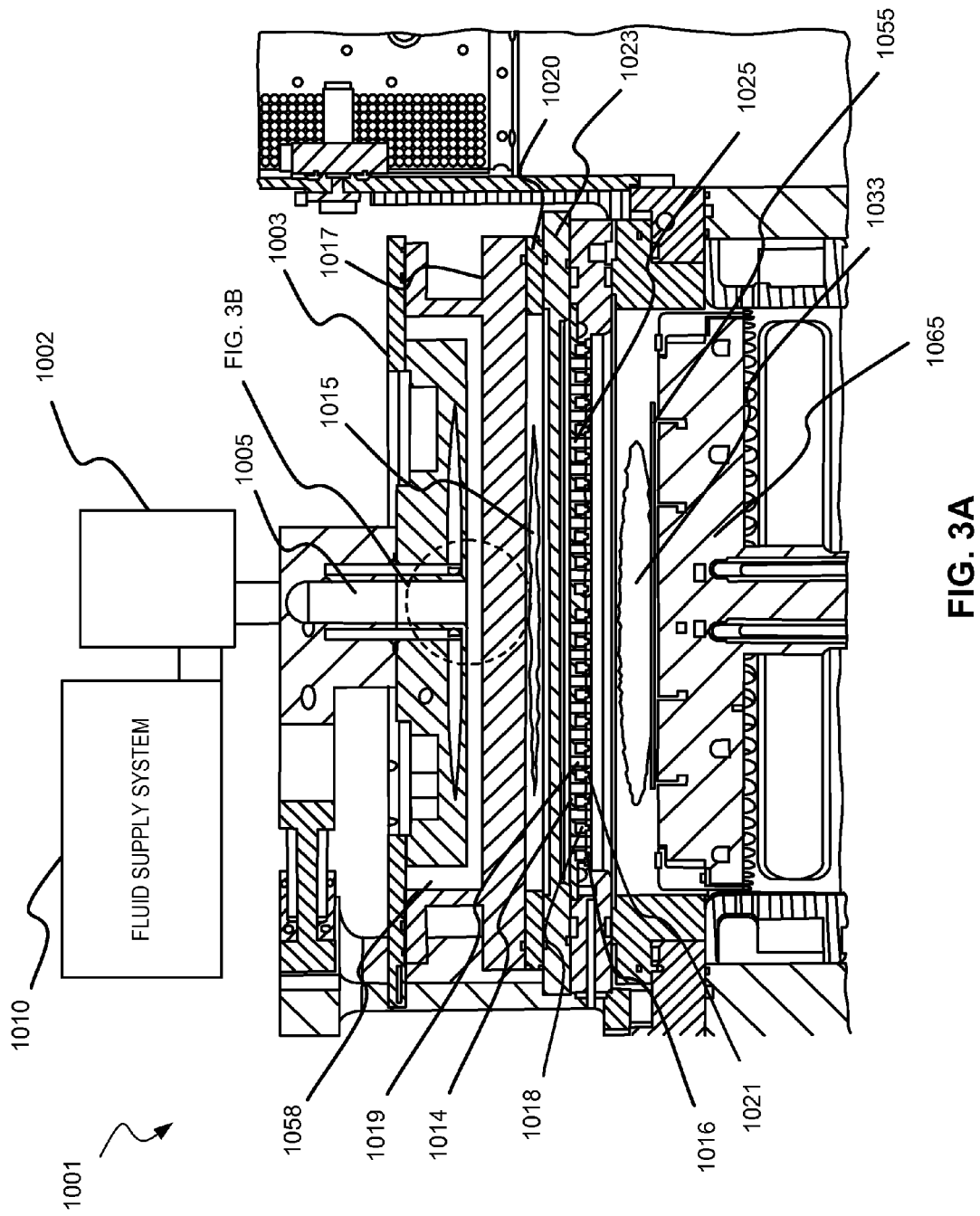
FIG. 3A shows a schematic cross-sectional view of a substrate processing chamber according to embodiments.

FIG. 3A shows a cross-sectional view of an exemplary substrate processing chamber 1001 with a partitioned plasma generation region within the processing chamber. During film etching, a process gas may be flowed into chamber plasma region 1015 through a gas inlet assembly 1005. A remote plasma system (RPS) 1002 may optionally be included in the system, and may process a first gas which then travels through gas inlet assembly 1005. The process gas may be excited within RPS 1002 prior to entering chamber plasma region 1015. Accordingly, the fluorine-containing precursor as discussed above, for example, may pass through RPS 1002 or bypass the RPS unit in embodiments.

A cooling plate 1003, faceplate 1017, ion suppressor 1023, showerhead 1025, and a substrate support 1065 (also known as a pedestal), having a substrate 1055 disposed thereon, are shown and may each be included according to embodiments. Pedestal 1065 may have a heat exchange channel through which a heat exchange fluid flows to control the temperature of the substrate. This configuration may allow the substrate 1055 temperature to be cooled or heated to maintain relatively low temperatures, such as between −20° C. to 200° C. Pedestal 1065 may also be resistively heated to relatively high temperatures, such as between 100° C. and 1100° C., using an embedded heater element.

Exemplary configurations may include having the gas inlet assembly 1005 open into a gas supply region 1058 partitioned from the chamber plasma region 1015 by faceplate 1017 so that the gases/species flow through the holes in the faceplate 1017 into the chamber plasma region 1015. Structural and operational features may be selected to prevent significant backflow of plasma from the chamber plasma region 1015 back into the supply region 1058, gas inlet assembly 1005, and fluid supply system 1010. The structural features may include the selection of dimensions and cross-sectional geometries of the apertures in faceplate 1017 to deactivate back-streaming plasma. The operational features may include maintaining a pressure difference between the gas supply region 1058 and chamber plasma region 1015 that maintains a unidirectional flow of plasma through the showerhead 1025. The faceplate 1017, or a conductive top portion of the chamber, and showerhead 1025 are shown with an insulating ring 1020 located between the features, which allows an AC potential to be applied to the faceplate 1017 relative to showerhead 1025 and/or ion suppressor 1023. The insulating ring 1020 may be positioned between the faceplate 1017 and the showerhead 1025 and/or ion suppressor 1023 enabling a capacitively coupled plasma (CCP) to be formed in the first plasma region.

The plurality of holes in the ion suppressor 1023 may be configured to control the passage of the activated gas, i.e., the ionic, radical, and/or neutral species, through the ion suppressor 1023. For example, the aspect ratio of the holes, or the hole diameter to length, and/or the geometry of the holes may be controlled so that the flow of ionically-charged species in the activated gas passing through the ion suppressor 1023 is reduced. The holes in the ion suppressor 1023 may include a tapered portion that faces chamber plasma region 1015, and a cylindrical portion that faces the showerhead 1025. The cylindrical portion may be shaped and dimensioned to control the flow of ionic species passing to the showerhead 1025. An adjustable electrical bias may also be applied to the ion suppressor 1023 as an additional means to control the flow of ionic species through the suppressor. The ion suppression element 1023 may function to reduce or eliminate the amount of ionically charged species traveling from the plasma generation region to the substrate. Uncharged neutral and radical species may still pass through the openings in the ion suppressor to react with the substrate.

Plasma power can be of a variety of frequencies or a combination of multiple frequencies. In the exemplary processing system the plasma may be provided by RF power delivered to faceplate 1017 relative to ion suppressor 1023 and/or showerhead 1025. The RF power may be between about 10 watts and about 5000 watts, between about 100 watts and about 2000 watts, between about 200 watts and about 1500 watts, or between about 200 watts and about 1000 watts in embodiments. The RF frequency applied in the exemplary processing system may be low RF frequencies less than about 200 kHz, high RF frequencies between about 10 MHz and about 15 MHz, or microwave frequencies greater than or about 1 GHz in embodiments. The plasma power may be capacitively-coupled (CCP) or inductively-coupled (ICP) into the remote plasma region.

A precursor, for example a fluorine-containing precursor, may be flowed into substrate processing region 1033 by embodiments of the showerhead described herein. Excited species derived from the process gas in chamber plasma region 1015 may travel through apertures in the ion suppressor 1023, and/or showerhead 1025 and react with an additional precursor flowing into substrate processing region 1033 from a separate portion of the showerhead. Alternatively, if all precursor species are being excited in chamber plasma region 1015, no additional precursors may be flowed through the separate portion of the showerhead. Little or no plasma may be present in substrate processing region 1033 during the remote plasma etch process. Excited derivatives of the precursors may combine in the region above the substrate and/or on the substrate to etch structures or remove species from the substrate.

The processing gases may be excited in chamber plasma region 1015 and may be passed through the showerhead 1025 to substrate processing region 1033 in the excited state. While a plasma may be generated in substrate processing region 1033, a plasma may alternatively not be generated in the processing region. In one example, the only excitation of the processing gas or precursors may be from exciting the processing gases in chamber plasma region 1015 to react with one another in substrate processing region 1033. As previously discussed, this may be to protect the structures patterned on substrate 1055.

Figure 3B:
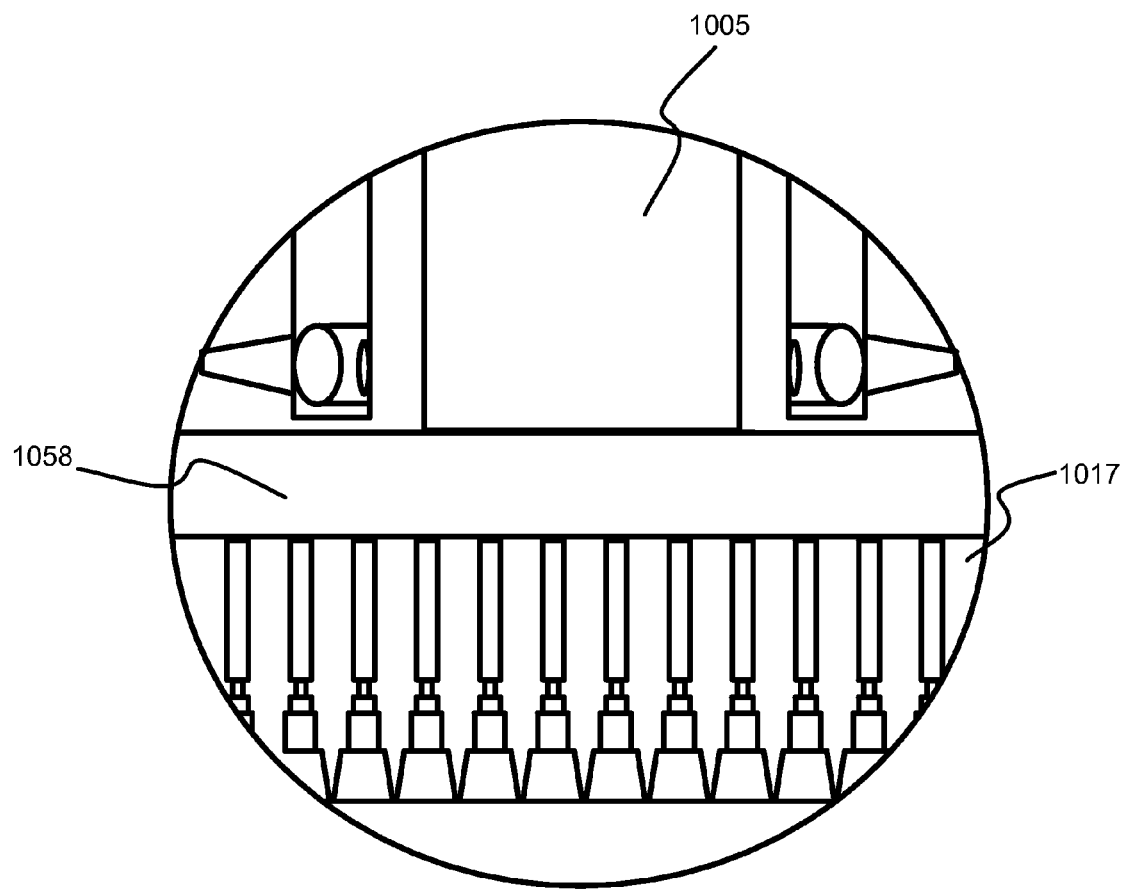
FIG. 3B shows a schematic cross-sectional view of a portion of a substrate processing chamber according to embodiments.

FIG. 3B shows a detailed view of the features affecting the processing gas distribution through faceplate 1017. The gas distribution assemblies such as showerhead 1025 for use in the processing chamber section 1001 may be referred to as dual channel showerheads (DCSH) and are additionally detailed in the embodiments described in FIG. 3A as well as FIG. 3C herein. The dual channel showerhead may provide for etching processes that allow for separation of etchants outside of the processing region 1033 to provide limited interaction with chamber components and each other prior to being delivered into the processing region.

The showerhead 1025 may comprise an upper plate 1014 and a lower plate 1016. The plates may be coupled with one another to define a volume 1018 between the plates. The coupling of the plates may be so as to provide first fluid channels 1019 through the upper and lower plates, and second fluid channels 1021 through the lower plate 1016. The formed channels may be configured to provide fluid access from the volume 1018 through the lower plate 1016 via second fluid channels 1021 alone, and the first fluid channels 1019 may be fluidly isolated from the volume 1018 between the plates and the second fluid channels 1021. The volume 1018 may be fluidly accessible through a side of the gas distribution assembly 1025. Although the exemplary system of FIGS. 3A-3C includes a dual-channel showerhead, it is understood that alternative distribution assemblies may be utilized that maintain first and second precursors fluidly isolated prior to substrate processing region 1033. For example, a perforated plate and tubes underneath the plate may be utilized, although other configurations may operate with reduced efficiency or not provide as uniform processing as the dual-channel showerhead as described.

In the embodiment shown, showerhead 1025 may distribute via first fluid channels 1019 process gases which contain plasma effluents upon excitation by a plasma in chamber plasma region 1015. In embodiments, the process gas introduced into RPS 1002 and/or chamber plasma region 1015 may contain fluorine, e.g., $NF_3$. The process gas may also include a carrier gas such as helium, argon, nitrogen ($N_2$), etc. Plasma effluents may include ionized or neutral derivatives of the process gas and may also be referred to herein as a radical-fluorine precursor referring to the atomic constituent of the process gas introduced.

Figure 3C:
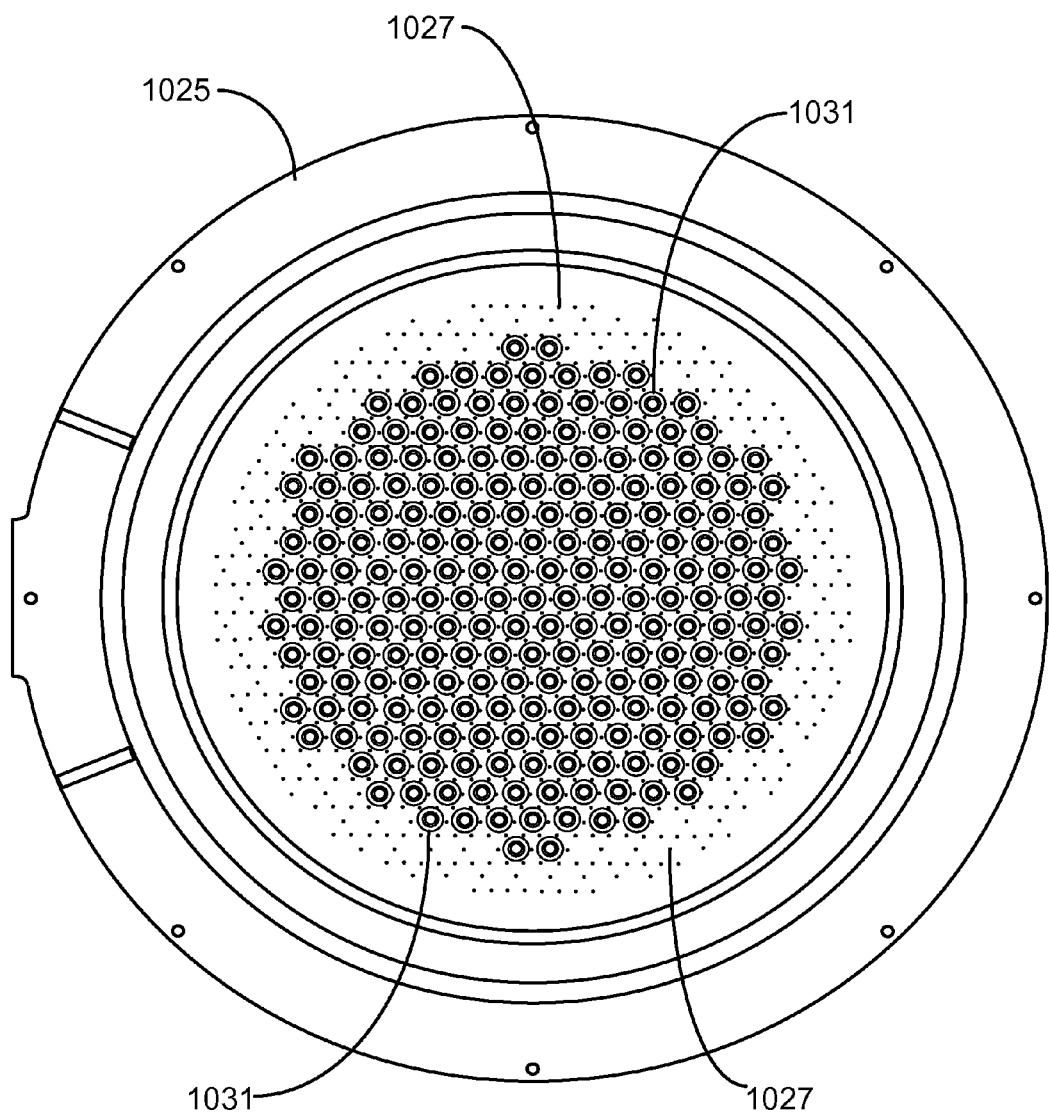
FIG. 3C shows a bottom view of a showerhead according to embodiments.

FIG. 3C is a bottom view of a showerhead 1025 for use with a processing chamber in embodiments. Showerhead 1025 corresponds with the showerhead shown in FIG. 3A. Through-holes 1031, which show a view of first fluid channels 1019, may have a plurality of shapes and configurations to control and affect the flow of precursors through the showerhead 1025. Small holes 1027, which show a view of second fluid channels 1021, may be distributed substantially evenly over the surface of the showerhead, even amongst the through-holes 1031, which may help to provide more even mixing of the precursors as they exit the showerhead than other configurations.

The chamber plasma region 1015 or a region in an RPS may be referred to as a remote plasma region. In embodiments, the radical fluorine precursor is created in the remote plasma region and travels into the substrate processing region where it may or may not combine with additional precursors. In embodiments, the additional precursors are excited only by the radical-fluorine precursor. Plasma power may essentially be applied only to the remote plasma region in embodiments to ensure that the radical-fluorine precursor provides the dominant excitation.

Combined flow rates of precursors into the chamber may account for 0.05% to about 20% by volume of the overall gas mixture; the remainder being carrier gases. The fluorine-containing precursor may be flowed into the remote plasma region, but the plasma effluents may have the same volumetric flow ratio in embodiments. In the case of the fluorine-containing precursor, a purge or carrier gas may be first initiated into the remote plasma region before the fluorine-containing gas to stabilize the pressure within the remote plasma region. Substrate processing region 1033 can be maintained at a variety of pressures during the flow of precursors, any carrier gases, and plasma effluents into substrate processing region 1033. The pressure may be maintained at levels given previously.

Figure 4:
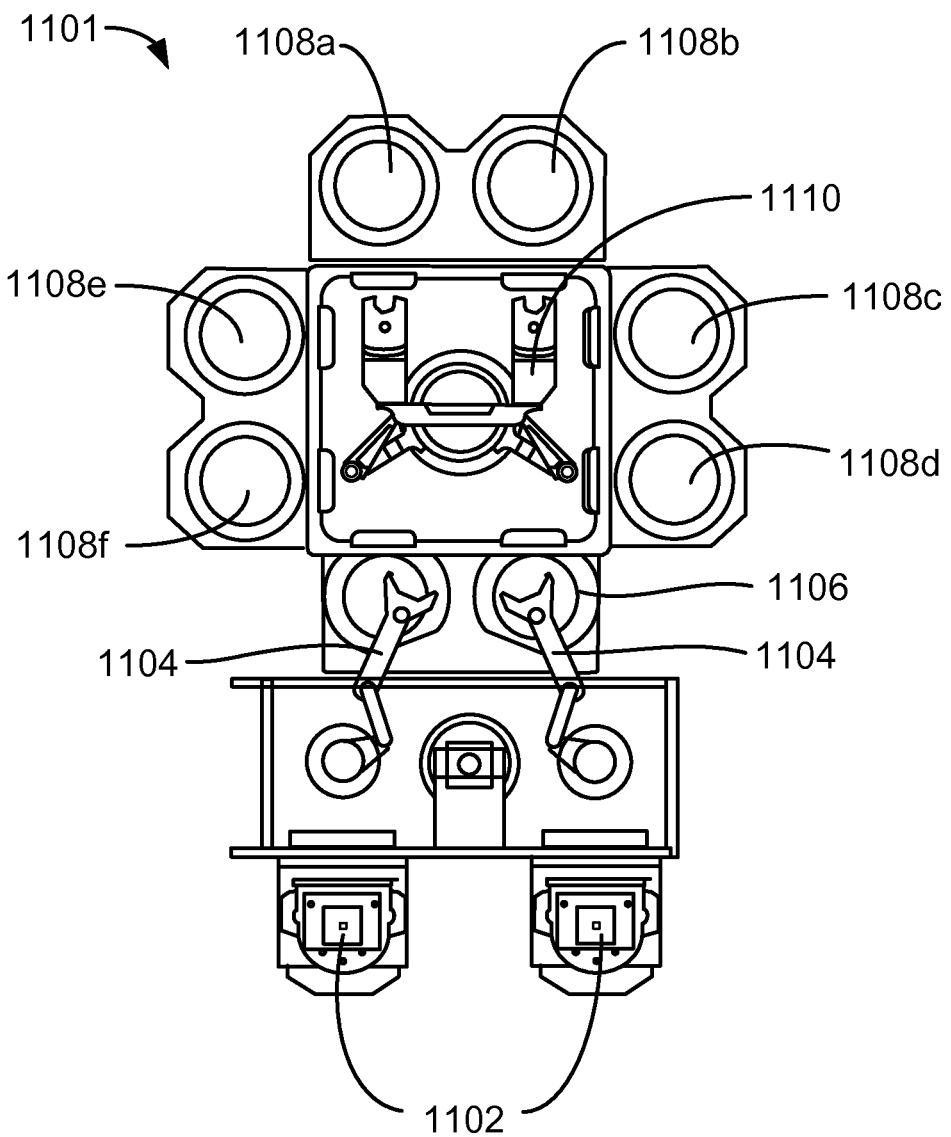
FIG. 4 shows a top view of an exemplary substrate processing system according to embodiments.

Embodiments of the dry etch systems may be incorporated into larger fabrication systems for producing integrated circuit chips. FIG. 4 shows one such processing system (mainframe) 1101 of deposition, etching, baking, and curing chambers in embodiments. In the figure, a pair of front opening unified pods (load lock chambers 1102) supply substrates of a variety of sizes that are received by robotic arms 1104 and placed into a low pressure holding area 1106 before being placed into one of the substrate processing chambers 1108a-f. A second robotic arm 1110 may be used to transport the substrate wafers from the holding area 1106 to the substrate processing chambers 1108a-f and back. Each substrate processing chamber 1108a-f, can be outfitted to perform a number of substrate processing operations including the dry etch processes described herein in addition to cyclical layer deposition (CLD), atomic layer deposition (ALD), chemical vapor deposition (CVD), physical vapor deposition (PVD), etch, pre-clean, degas, orientation, and other substrate processes.

Nitrogen trifluoride (or another fluorine-containing precursor) may be flowed into chamber plasma region 1020 at rates between about 5 sccm and about 200 sccm, between about 10 sccm and about 150 sccm or between about 15 sccm and about 75 sccm in embodiments. Water vapor may be flowed into substrate processing region 1070 at rates between about 5 sccm and about 100 sccm, between about 10 sccm and about 50 sccm or between about 15 sccm and about 25 sccm according to embodiments. The showerhead may be referred to as a dual-channel showerhead as a result of the two distinct pathways into the substrate processing region. The fluorine-containing precursor may be flowed through the through-holes in the dual-zone showerhead and the water vapor may pass through separate zones in the dual-zone showerhead and wherein the separate zones may open into the substrate processing region but not into the remote plasma region as described above.

Combined flow rates of water vapor and plasma effluents into the substrate processing region may account for 0.05% to about 20% by volume of the overall gas mixture; the remainder being carrier gases. The fluorine-containing precursor is flowed into the remote plasma region but the plasma effluents has the same volumetric flow ratio, in embodiments. In the case of the fluorine-containing precursor, a purge or carrier gas may be first initiated into the remote plasma region before those of the fluorine-containing gas to stabilize the pressure within the remote plasma region.

As used herein "substrate" may be a support substrate with or without layers formed thereon. The patterned substrate may be an insulator or a semiconductor of a variety of doping concentrations and profiles and may, for example, be a semiconductor substrate of the type used in the manufacture of integrated circuits. Exposed "silicon oxide" of the patterned substrate is predominantly $SiO_2$ but may include concentrations of other elemental constituents such as nitrogen, hydrogen, carbon and the like. In some embodiments, silicon oxide portions etched using the methods disclosed herein consist essentially of silicon and oxygen. The term "precursor" is used to refer to any process gas which takes part in a reaction to either remove material from or deposit material onto a surface. "Plasma effluents" describe gas exiting from the chamber plasma region and entering the substrate processing region. Plasma effluents are in an "excited state" wherein at least some of the gas molecules are in vibrationally-excited, dissociated and/or ionized states. A "radical precursor" is used to describe plasma effluents (a gas in an excited state which is exiting a plasma) which participate in a reaction to either remove material from or deposit material on a surface. A "radical-fluorine precursor" is a radical precursor which contains fluorine but may contain other elemental constituents. The phrase "inert gas" refers to any gas which does not form chemical bonds when etching or being incorporated into a film. Exemplary inert gases include noble gases but may include other gases so long as no chemical bonds are formed when (typically) trace amounts are trapped in a film.

The terms "gap" and "trench" are used throughout with no implication that the etched geometry has a large horizontal aspect ratio. Viewed from above the surface, trenches may appear circular, oval, polygonal, rectangular, or a variety of other shapes. A trench may be in the shape of a moat around an island of material. The term "via" is used to refer to a low aspect ratio trench (as viewed from above) which may or may not be filled with metal to form a vertical electrical connection. As used herein, a conformal etch process refers to a generally uniform removal of material on a surface in the same shape as the surface, i.e., the surface of the etched layer and the pre-etch surface are generally parallel. A person having ordinary skill in the art will recognize that the etched interface likely cannot be 100% conformal and thus the term "generally" allows for acceptable tolerances.

The term "precursor" is used to refer to any process gas which takes part in a reaction to either remove material from or deposit material onto a surface. "Plasma effluents" describe gas exiting from the chamber plasma region and entering the substrate processing region. Plasma effluents are in an "excited state" wherein at least some of the gas molecules are in vibrationally-excited, dissociated and/or ionized states. A "radical precursor" is used to describe plasma effluents (a gas in an excited state which is exiting a plasma) which participate in a reaction to either remove material from or deposit material on a surface. "Radical-fluorine" describes radical precursors which contain fluorine but may contain other elemental constituents. The phrase "inert gas" refers to any gas which does not form chemical bonds when etching or being incorporated into a film. Exemplary inert gases include noble gases but may include other gases so long as no chemical bonds are formed when (typically) trace amounts are trapped in a film.

Having disclosed several embodiments, it will be recognized by those of skill in the art that various modifications, alternative constructions, and equivalents may be used without departing from the spirit of the disclosed embodiments. Additionally, a number of well-known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the dielectric material" includes reference to one or more dielectric materials and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

The invention claimed is:

1. A method of etching a patterned substrate, the method comprising:
   placing the patterned substrate in a substrate processing region of a substrate processing chamber, wherein the patterned substrate has an exposed doped silicon oxide portion and a second exposed silicon oxide portion;
   flowing a fluorine-containing precursor into a remote plasma region fluidly coupled to the substrate processing region while forming a remote plasma in the remote plasma region to produce plasma effluents;
   flowing a hydrogen-and-oxygen-containing precursor into the substrate processing region without first passing the hydrogen-and-oxygen-containing precursor through the remote plasma region, wherein the hydrogen-and-oxygen-containing precursor comprises an OH group;
   maintaining a relative humidity in the substrate processing region, wherein the relative humidity is below 14%; and
   etching the exposed doped silicon oxide portion by flowing the plasma effluents into the substrate processing region, wherein the exposed doped silicon oxide portion has a higher dopant concentration than the second exposed silicon oxide portion and wherein the exposed doped silicon oxide portion etches at a first etch rate and the second exposed silicon oxide portion etches at a second etch rate which is lower than the first etch rate.

2. The method of claim 1 wherein the first etch rate exceeds the second etch rate by a factor of about 8 or more.

3. The method of claim 1 wherein the substrate processing region is plasma-free during the operation of etching the exposed doped silicon oxide portion.

4. The method of claim 1 wherein the hydrogen-and-oxygen-containing precursor is not excited by any plasma formed outside the substrate processing region prior to entering the substrate processing region.

5. The method of claim 1 wherein the fluorine-containing precursor comprises a precursor selected from the group consisting of atomic fluorine, diatomic fluorine, nitrogen trifluoride, carbon tetrafluoride, hydrogen fluoride and xenon difluoride.

6. The method of claim 1 wherein the remote plasma region, the substrate processing region, the fluorine-containing precursor and the plasma effluents are essentially devoid of hydrogen.

7. The method of claim 1 wherein the fluorine-containing precursor flowed through through-holes in a dual-zone showerhead and the hydrogen-and-oxygen-containing precursor passes through separate zones in the dual-zone showerhead, wherein the separate zones open into the substrate processing region but not into the remote plasma region.

8. The method of claim 1 wherein the hydrogen-and-oxygen-containing precursor comprises one of water vapor or an alcohol.

9. The method of claim 1 wherein the exposed doped silicon oxide portion is doped with one or more of boron and phosphorus.

10. A method of etching a patterned substrate, the method comprising:
    placing the patterned substrate in a substrate processing region of a substrate processing chamber, wherein the patterned substrate has an exposed phosphorus-doped silicon oxide portion and a second exposed silicon oxide portion and wherein the exposed phosphorus-doped silicon oxide portion has an exposed phosphorus-depleted outer portion;
    flowing a fluorine-containing precursor into a remote plasma region fluidly coupled to the substrate processing region while forming a remote plasma in the remote plasma region to produce plasma effluents;
    flowing a hydrogen-and-oxygen-containing precursor into the substrate processing region without first passing the hydrogen-and-oxygen-containing precursor through the remote plasma region, wherein the hydrogen-and-oxygen-containing precursor comprises an OH group;
    maintaining a first relative humidity in the substrate processing region;
    removing the exposed phosphorus-depleted outer portion of the exposed phosphorus-doped silicon oxide portion;
    reducing a relative humidity in the substrate processing region from the first relative humidity to a second relative humidity, wherein the second relative humidity is less than the first relative humidity; and
    etching the exposed phosphorus-doped silicon oxide portion by flowing the plasma effluents into the substrate processing region, wherein the exposed phosphorus-doped silicon oxide portion has a higher phosphorus concentration than the second exposed silicon oxide portion and wherein the exposed phosphorus-doped silicon oxide portion etches at a first etch rate and the second exposed silicon oxide portion etches at a second etch rate which is lower than the first etch rate.

11. The method of claim 10 wherein an atomic concentration of phosphorus is greater than 5% within the exposed phosphorus-doped silicon oxide portion.

12. The method of claim 10 wherein an atomic concentration of phosphorus is less than 1% within the exposed phosphorus-depleted outer portion.

13. The method of claim 10 wherein a thickness of the exposed phosphorus-depleted silicon oxide portion may be less than 1 nm.

14. A method of etching a patterned substrate, the method comprising:
   placing the patterned substrate in a substrate processing region of a substrate processing chamber, wherein the patterned substrate has a first exposed phosphorus-doped silicon oxide portion and a second exposed phosphorus-doped silicon oxide portion;
   flowing nitrogen trifluoride into a remote plasma region fluidly coupled to the substrate processing region while forming a remote plasma in the remote plasma region to produce plasma effluents;
   flowing water vapor into the substrate processing region without first passing the water vapor through the remote plasma region;
   maintaining a relative humidity of less than 14% in the substrate processing region; and
   etching the first exposed phosphorus-doped silicon oxide portion by flowing the plasma effluents into the substrate processing region, wherein the first exposed phosphorus-doped silicon oxide portion has a higher atomic concentration of phosphorus than the second exposed phosphorus-doped silicon oxide portion and wherein the first exposed phosphorus-doped silicon oxide portion etches at a first etch rate and the second exposed phosphorus-doped silicon oxide portion etches at a second etch rate which is lower than the first etch rate.

15. The method of claim 14 wherein the first exposed phosphorus-doped silicon oxide portion and the second exposed phosphorus-doped silicon oxide portion each form sidewalls of a high aspect ratio trench and wherein the first exposed phosphorus-doped silicon oxide portion forms sidewalls deeper within the high aspect ratio trench than the second exposed phosphorus-doped silicon oxide portion.

* * * * *